United States Patent [19]

Watanabe et al.

[11] 3,985,928

[45] Oct. 12, 1976

[54] HEAT-RESISTANT LAMINATING RESIN COMPOSITION AND METHOD FOR USING SAME

[75] Inventors: Tsutomu Watanabe; Sigenori Yamaoka, both of Yokohama, Japan

[73] Assignee: Sumitomo Bakelite Company, Limited, Tokyo, Japan

[22] Filed: Apr. 28, 1975

[21] Appl. No.: 572,451

[30] Foreign Application Priority Data

June 3, 1974 Japan.............................. 49-61855

[52] U.S. Cl............................... 428/273; 156/313; 156/331; 156/330; 156/332; 260/32.6 NT; 260/836; 260/837 R; 260/830 P; 260/857 PE; 427/386; 428/417; 428/435; 428/901; 428/418; 428/474; 428/920

[51] Int. Cl.²........................................... C09J 7/00

[58] Field of Search........... 156/313, 331, 330, 332; 428/901, 261, 920, 273, 432, 474, 435, 413–418; 260/32.6 NT, 837 R, 857 PI, 836, 830 P, 47 EC, 2 EC, 784 R; 427/386

[56] References Cited
UNITED STATES PATENTS

| | | | |
|---|---|---|---|
| 3,099,638 | 7/1963 | Foster | 260/837 R |
| 3,207,718 | 9/1965 | Zimmerman et al. | 156/330 |
| 3,381,054 | 4/1968 | Le Blanc et al. | 156/331 |
| 3,625,912 | 12/1971 | Vincent et al. | 260/32.6 NT |
| 3,637,901 | 1/1972 | Bargain et al. | 260/830 P |
| 3,700,538 | 10/1972 | Kennedy | 156/313 |
| 3,712,933 | 1/1973 | Docloux et al. | 260/32.6 NT |
| 3,725,345 | 4/1973 | Bargain | 260/47 EC |
| 3,730,948 | 5/1973 | Akiyama et al. | 260/836 |
| 3,759,779 | 9/1973 | Dumas | 156/331 |
| 3,763,087 | 10/1973 | Holub et al. | 260/837 R |
| 3,839,493 | 10/1974 | Balme et al. | 260/830 P |
| 3,931,354 | 1/1976 | Sheppard et al. | 427/386 |
| 3,936,575 | 2/1976 | Watanabe et al. | 156/330 |

*Primary Examiner*—William A. Powell
*Assistant Examiner*—J. J. Gallagher
*Attorney, Agent, or Firm*—Karl W. Flocks

[57] ABSTRACT

A heat-resistant resin composition suitable for use in multilayer super high density printed circuit boards, comprising a polyaminobismaleimide, a polyepoxy compound, and an aromatic vinyl copolymer containing as structural unit maleic anhydride and/or an alkyl maleate. This resin composition is excellent in thermal resistance and dimensional stability, which are important properties of a resin composition for practical use in lamination, and when used in lamination, exhibits favorable flow and curing properties so that it can be easily and economically processed under conventional laminating conditions. When used as a multilayer printed circuit board material, it is also characterized by excellent adhesion to a copper foil, particularly in bonding an inner circuit copper foil to the board. Although particularly suitable for use in multilayer printed circuit boards of numerous layers (eight or more layers) bearing highly packed circuits and as an interlayer adhesive sheet, the present resin composition can be used in general heat-resistant printed circuit boards and in general heat-resistant structural laminates.

25 Claims, No Drawings

HEAT-RESISTANT LAMINATING RESIN COMPOSITION AND METHOD FOR USING SAME

This invention relates to a novel heat-resistant resin composition suitable for high density printed circuit boards and the like used in electronic equipments.

The board materials which have heretofore been used most frequently for printed wiring in electronic equipments are phenolic resin laminates and epoxy resin laminates. However, with the recent progress in space development and communication industry, the requests for more improved function of an equipment, pursuit of higher reliability of an equipment, and higher wiring density have become more increased and the conventional materials have become unsatisfactory.

Phenolic resin laminates have been found unsatisfactory in electric characteristics and heat resistance to carry advanced functional elements such as IC and LSI (Large Scale Integrated Circuit). On the other hand, on account of its low glass transition temperature, an epoxy resin laminate suffers from appreciable dimensional change caused by circuit-forming treatments, and a printed circuit board of the epoxy resin reveals, at elevated temperatures, deterioration in electrical and mechanical performance, resulting in a decreased reliability of the allied electronic equipments.

It has been general to assemble a multilayer printed board, which is a typical high-density printed circuit board, by use of copper-clad epoxy resin-glass cloth laminates and prepregs of the same materials. However, in manufacturing a large printed circuit backboard for computer or a super high density multilayer (eight or more layers) printed circuit board, for space development, if conventional copper-clad epoxy-glass laminates are used, the reproducibility of the wiring pattern is poor and the high-precision positioning of the circuits becomes impossible because of an intolerably large dimensional change in the face direction due to the thermal history in circuit production and to heat and pressure applied during press-molding of the assembled layers; drilling of the printed circuit board is often disturbed by the occurrence of warp and twist; and the through-hole is easily damaged by thermal shock while in use because of a relatively large linear expansion coefficient in the direction of thickness of the laminate. Consequently, an epoxy resin laminate has a limit in application as a high-performance part.

Polyaminobismaleimide resins are known as new heat-resistant termosetting resins obtained by addition reaction of an N,N'-bismaleimide with a diamine, excellent in mechanical characteristics at high temperatures and resistance to thermal deterioration, and very small in linear expansion coefficient. Therefore, said resin is preferable as the abovementioned high-precision multilayer printed circuit board material, and its application is being tried.

The polyaminobismaleimide resin by itself, however, is poor in curability under the conditions for press-molding a usual laminate, and hence, requires pressing for a long period of time at a temperature as high as at least 200° C. or after-baking at a temperature of 200° C. or higher, for a long period of time, after pressing at 170° to 200° C.

The polyaminobismaleimide resin, moreover, is poor in flow property at the time of pressing, tends to occlude voids between layers of the base materials and is inferior in bond strength between layers of the base materials. Therefore, cracks tend to be caused in the layers in drilling a laminate or forming an external shape. The resin, moreover, is extremely poor in adhesion of the board to a copper foil, particularly adhesion of the prepeg to the copper foil of the inner layer circuit, which adhesion is the most important requirement for a multilayer printed circuit board. Such a defective board, therefore, cannot meet the requirements for processing and assembling, and encounters great difficulties in actual service.

Since the polyaminobismaleimide resin, on the other hand, contains in its molecule reactive groups bearing active amino-hydrogen, it can be used jointly with an epoxy resin and the like to improve, to a certain extent, the curability, moldability, and adhesive strength when used in copper-clad laminates. Incorporation of a large amount of an epoxy resin, however, brings about a decrease in heat resistance, while adhesion of the inner layer of a multilayer printed circuit board is not sufficiently improved; an adhesive strength sufficient for practical use cannot be obtained even when the copper foil is surface-treated mechanically or chemically.

The present inventors have conducted extensive studies for obtaining a resin composition which has the excellent heat resistance and dimensional stability of the polyaminobismaleimide resin, is free from the above-mentioned disadvantages in production of laminate and has very excellent adhesive strength. As a result, it has been found that incorporation of a specific acid type high molcular weight compound into the polyaminobismaleimide/epoxy resin system is very effective for obtaining the above-mentioned resin composition.

An object of this invention is to provide a novel heat-resistant laminating resin composition.

Another object of this invention is to provide a resin composition having an excellent adhesive properties.

A further object of this invention is to provide a resin composition suitable for use in super high density multilayer printed circuit boards.

Other objects and advantages of this invention will become apparent from the following description.

According to the present invention, there is provided a heat-resistant laminating resin composition consisting essentially of 100 parts by weight of a polyaminobismaleimide, 10 to 300 parts by weight of a polyepoxy compound having in the molecule at least two epoxy groups, and 5 to 150 parts by weight of at least one copolymer selected from the group consisting of (A) copolymers of aromatiic vinyl compounds and maleic anhydride, (B) partial alkyl esters of said copolymers (A), (C) copolymers of aromatic vinyl compounds and alkyl maleates, and (D) copolymers of aromatic vinyl compounds, maleic anhydride, and alkyl maleates.

The polyaminobismaleimide is a prepolymer obtained by addition reaction of an N,N'-bismaleimide represented by the general formula [I]

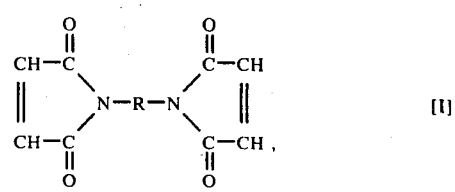

wherein R represents an aliphatic, cycloaliphatic, or aromatic divalent radical, with an aliphatic, cycloaliphatic, or aromatic diamine. A typical polyaminobismaleimide is a prepolymer having the general formula [II]

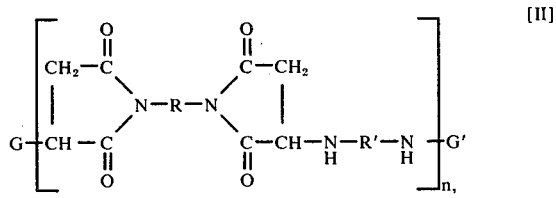

wherein R and R' represent aliphatic, cycloaliphatic, or aromatic divalent radicals; G is

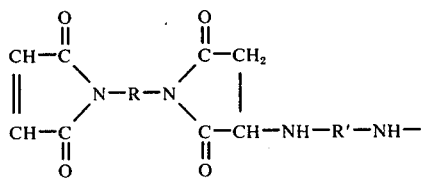

or H₂N — R' — NH - in which R and R' are as defined above; G' is — H or

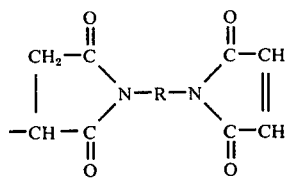

in which R is as defined above; and $n$ is an integer of at least one, preferably 1 to 50.

Examples of N,N'-bismaleimides represented by the general formula [I] include N,N'-ethylenebismaleimide, N,N'-hexamethylenebismaleimide, N,N'-decamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether)bismaleimide, N,N'-(4,4'-dipheyl sulfone)bismaleimide, N,N'-(4,4'-dicycohexylmethane)-bismaleimide, N,N'-m-xylenebismaleimide, N,N'-(4,4'-diphenylcyclohexane)bismaleimide, etc. Examples of diamines to be reacted with the bismaleimides include straight chain aliphatic diamines having 2 to 20 carbon atoms such as ethylenediamine, trimethylenediamine, tetramethylenediamine, hexamethylenediamine, and the like; and aromatic and cycloaliphatic diamines such as m-phenylenediamine, p-phenylenediamine, p-xylenediamine, 4,4'-diaminodiphenylmethane, 4,4'-diaminodiphenylpropane, 4,4'-diaminodiphenyl ether, 4,4'-diaminodiphenyl sulfone, 4,4'-diaminocyclohexane, -diainodicyclohexane, 1,4-diaminocyclohexane, bis(4-aminophenyl)phenylmethane, 1,5-diaminonaphthalene, m-xylenediamine, p-xylylenediamine, 1,1-bis(4-aminophenyl)cyclohexane, and the like.

The aforesaid prepolymer can be prepared according to, for example, Japanese Patent Publication No. 42,160/72 (Rhone-Poulenc Co., France) by reacting a bismaleimide and a diamine at 50° to 250° C., preferably 50° to 170° C., for several minutes to several hours. Although the ratio of the diamine to the bisimide is not critical, it is preferable to use the reactants so that 0.5 to 3 reactive amino hydrogen atoms may be available per one carbon-to-carbon double bond of the bisimide. The reaction between the bisimide and the diamine can be conducted either in the molten state or in a suitable solvent such as dimethylformamide, dimethyl sulfoxide, N-methylpyrrolidone, or the like. In the case of reaction in the molten state, the reaction mixture obtained after the reaction for a predetermined period of time is cooled and the resulting solid prepolymer is pulverized. When the reaction is conducted in the solvent, the reaction mixture obtained after the reaction for a predetermined period of time is cooled and, if necessary, diluted to obtain a prepolymer solution.

In view of the reaction mechanism, the prepolymer thus prepared may contain, beside the addition product of the bisimide and the diamine, those polymers which are formed by radical polymerization of the bisimide or the prepolymer itself at the terminal double bonds. However, even if such polymers are present, the prepolymer can be used in the composition of this invention without causing any trouble. Any reaction mixture of the bisimide and the diamine may be used so long as it is a so-called B-stage product having a proper melting point range and a sufficient reactivity to cause curing on further heating. The melting point range of the prepolymer or the reaction mixture of the bisimide and the diamine can be properly regulated by controlling heating conditions and the aforesaid reactant ratio. A prepolymer having a melting point range between 50° and 150° C. is preferable.

Having imide linkages in its molecule, the polyaminobismaleimide is very stable both thermally and chemically and imparts to the present resin composition a high resistance to thermal deterioration, excellent mechanical and electrical characteristics at elevated temperatures (above 150° C.), and a distinguished dimensional stability, so that it is made possible to manufacture a laminate which is able to endure severe conditions under which it is processed and used. Since the polyaminobismaleimide contains also residual reactive amino groups in its molecule, it is rich in self-polymerizability and reactivity with the polyepoxy compound incorporated in the present resin composition and imparts to the resin composition the B-stage properties which are necessary in coating or impregnating a laminating base material and a property of further reacting, by heat and pressure applied in the molding step, to form a three-dimensional structure, that is, the thermosetting property.

Although the epoxy compound for use in this invention may be any compound having in its molecule at least two epoxy groups, an ordinary epoxy resin having an epoxy equivalent of 100 to 4,000 is preferable. Examples of such polyepoxy compounds include diglycidyl ethers obtained by reaction of bisphenol-A or halogenated bisphenol-A and epihalohydrin [Epikote (registered tradmark) 828, 1001, 1004, 1007, 1045, etc. of Shell Chemical Corp.]; polyether type polyglycidyl ethers obtained by reaction of epihalohydrin and a polyhydric alcohol obtained by reacting bisphenol-A with an alkylene oxide with an acid or alkali catalyst (EP-4000, etc. of Asahi Denka Kogyo Co.); polyglycidyl ethers or esters obtained by reaction of an aromatic polyhydric alcohol or aromatic polycarboxylic acid and an epihalohydrin; polyglycidyl ethers of an aliphatic polyether or polyhydric alcohol such as glycerin, trimethylolpropane, butanediol, a polyalkylene glycol or the like; cycloaliphatic polyepoxy compound having a structure of cyclohexene oxide or cyclopentadiene oxide; polyglycidyl ethers of novolak-type phenolformaldehyde resins; and the like.

Such a polyepoxy compound enhances the curability of the polyaminobismaleimide in lamination and enables the resin composition to cure sufficiently at 170° to 200° C., so that after-baking is hardly necessary. The polyepoxy compound, moreover, brings about an improvement in flow property of the resin composition at the time of molding, so that voids are prevented from being formed between the layers of the base materials, and the adhesion between layers of base materials as well as the adhesion between the board and the copper foil are improved. Thus, the basic characteristics necessary for laminate and copper-clad laminate are imparted.

However, since the polyepoxy compound added in great excess relative to the polyaminobismaleimide tends to decrease the excellent heat resistance of the latter, there is a limit in respect of the amount of the polyepoxy compound to be added. In the present invention, 10 to 300 parts by weight of the polyepoxy compound can be used per 100 parts by weight of the polyaminobismaleimide. If it is used in an amount smaller than 10 parts by weight, the resin composition is not improved in curability and moldability, while if the amount exceeds 300 parts by weight, the laminate becomes inferior in heat distortion temperature, characteristics at temperatures above 150° C., and resistance to thermal deterioration. The preferable mixing ratio is 20 to 200 parts by weight of the polyepoxy compound per 100 parts by weight of the polyaminobismaleimide.

In the present invention, the resin composition contains the specific acid type high molecular weight compound in addition to the above-noted polyaminobismaleimide and polyepoxy compound. The acid type high molecular weight compound is at least one copolymer selected from the group consisting of A. copolymers of aromatic vinyl compounds and maleic anhydride, B. partial alkyl esters of said copolymers (A), C. copolymers of aromatic vinyl compounds and alkyl maleates, and D. copolymers of aromatic vinyl compounds, maleic anhydride, and alkyl maleates.

The aromatic vinyl compounds used in the copolymers (A), (B), (C), and (D) include, for example, styrene; styrene derivatives such as methylstyrene, dimethylstyrene, ethylstyrene, α-methylstyrene, α-methyl-p-isopropylstyrene, and divinylbenzene, and halogenated styrene derivatives. Copolymers containing two or more types of aromatic vinyl compounds may be used.

The copolymer (A) is obtained by copolymerization of the aromatic vinyl compound and maleic anhydride and preferably contains in the molecule at least 30 mole-% of the maleic anhydride structural unit.

The copolymer (B) is obtained by partial esterification of the copolymer (A) with an aliphatic alcohol and may contain structural units of maleic anhydride, maleic acid, monoalkyl maleate, and dialkyl maleate. Preferably the copolymer has a degree of esterification of 50 mole-% or less based on the total amount of the maleic anhydride structural unit before esterification.

The copolymer (C) is obtained by copolymerization of the aromatic vinyl compound with a monoalkyl maleate and dialkyl maleate and preferably contains in the molecule at least 30 mole-% of the monoalkyl maleate structural unit.

The copolymer (D) is obtained by copolymerization of the aromatic vinyl compound, maleic anhydride, and monoalkyl maleate and/or dialkyl maleate and preferably contains in the molecule at least 30 mole-% of the maleic anhydride structural unit or at least 30 mole-% in total of the maleic anhydride structural unit and the monoalkyl maleate structural unit.

The alkyl groups of the alkyl maleates in the copolymers (B), (C), and (D) are those having 1 to 20, preferably 1 to 10, carbon atoms such as, for example, methyl, ethyl, n-propyl, isopropyl, n-butyl, isobutyl, tert-butyl, n-pentyl, n-hexyl, tert-amyl, n-heptyl, n-oxtyl, 2-ethyl-1-hexyl, n-nonyl, n-decyl, etc. The copolymers (C) and (D) may contain two or more alkyl groups.

These copolymers have a number-average molecular weight of 1,000 to 60,000, preferably 2,000 to 30,000. They are thermally stable, high molecular weight substances and, owing to the high carboxylic anhydride group content or high carboxyl group content, can react with not only the polyepoxy compound but also the residual amino groups in the polyaminobismaleimide to increase the density of cross-linkage between the resin components.

Consequently, by the joint use of the acid type copolymer, it is possible to prevent the tendency of decreasing of heat resistance which appears when the polyepoxy compound is added alone, and hence, the polyepoxy compound can be added in an amount as large as 100 parts by weight or more per 100 parts by weight of the polyaminobismaleimide to improve markedly the moldability and other properties of the resin composition without deterioration in heat resistance.

Further, the addition of the acid type copolymer brings about a marked increase in adhesive properties between the polyaminobismaleimide/epoxy resin composition and the metal foil, particularly copper foil, and as a result, the adhesive strength of the inner copper foil has, for the first time, reached a sufficiently practical level as a multilayer printed circuit board which has to endure severe treatment conditions. Moreover, the reactivity of the acid type copolymer with the polyaminobismaleimide and the epoxy resin is very high and results in an increase in cure rate of the resin composition, whereby such a practically very advantageous curability is imparted that the resin composition can be sufficiently cured at 150° – 170° C which is the pressing temperature range for an ordinary laminate, to exhibit characteristic properties.

The acid type high molecular weight compound selected from the copolymers (A), (B), (C), and (D) is incorporated into the resin composition in an amount of 5 to 150, preferably 10 to 100, parts by weight per 100 parts by weight of the polyaminobismaleimide. If the amount incorporated is below 5 parts by weight, the effect on heat resistance and adhesion is insufficient, while if it exceeds 150 parts by weight, the mechanical characteristics and chemical resistance of the laminate are deteriorated.

The weight ratio of the polyepoxy compound to the acid type high molecular weight compound in the present resin composition, though not critical, is preferably in the range from 0.5 to 10.0.

The present resin composition, if necessary, can be admixed with small amounts of conventional hardeners for epoxy resins, low-molecular-weight epoxy compounds, flame retardants, fillers, and colorants. The addition of such ingredients enables the resulting laminate to be used for special purposes.

In manufacturing a laminate by use of the present resin composition, a varnish of a concentration of 20 to 50 % by weight is prepared by dissolving the resin composition in an inert solvent such as amides, for example, N,N-dimethylformamide, N,N-dimethylacetamide, and the like; lactones, for example, N-methyl-2-pyrrolidone, γ-butyrolactone and the like; and lactams, for example, caprolactam, and the like or in a mixture of the inert solvent and an aromatic hydrocarbon or a ketone. A fibrous base material such as glass cloth, glass paper, asbestos paper, carbon fiber cloth, or the like, which has been treated with an appropriate coupling agent, is impregnated with the above varnish by means of a coater-drier, and dried at 130° ± 40° C. for 1 to 30 minutes to prepare a B-stage prepreg having a resin content of 30 to 60 % by weight. One or more sheets of the prepreg are placed one on another to a desired total thickness of 0.1 mm to several millimeters and, if necessary, a foil of metal such as copper, aluminum, nichrome or the like is placed on one or both sides of the resulting assembly. The thus obtained assembly is subjected to heating under pressure by means of a hot-platen press to obtain a laminate or a metal-clad laminate. The heating under pressure is conducted at a temperature of 120° to 250° C., and a pressure of 5 to 200 kg/cm$^2$, for 15 to 240 minutes. On account of the markedly improved curability of the present resin composition, the molding of the laminate can be effected at a temperature much lower than the molding temperature in the case where a conventional polyimide resin or polyaminobismaleimide resin is used alone, for example, at 150° – 180° C for 30 – 180 min.

The thus molded laminate, when the present resin composition is used, has satisfactory characteristics without being after-baked. However, in order to relieve the strain developed during the molding cycle and to effectively develope the excellent dimensional stability of the resin composition, it is preferable to subject the molded laminate to heat treatment to a certain extent, and, if necessary, the molded laminate may be after-baked at 180° to 250° C. for several to 20 hours.

A multilayer printed circuit board can be manufactured in the following way using the present resin composition: For example, an inner printed circuit board is formed by use of the above-mentioned both side-copper-clad laminate of glass-cloth-base material, and, if necessary, surface-treated chemically or mechanically. The present prepreg is interposed between several sheets of the inner circuit board and between the inner circuit and the board side of the one-side copper-clad laminate for surface circuit, and the positions of the prepreg, the inner circuit boards and the surface circuit laminate are adjusted to the respective correct positions by means of a metal plate with a guide pin, and the resulting assembly is press-molded between hot platens under application of heat and pressure to form a multilayer board. Surface circuits and through-holes are formed to obtain a finished multilayer printed circuit board.

The laminate and copper-clad laminate manufactured by use of the present resin composition show little deterioration in flexural strength, modulus of elasticity in flexure, and adhesive strength when exposed to an elevated temperature above 150° C. and in mechanical characteristics and adhesive strength when used at an elevated temperature between 150° and 200° C. for a long period of time, and hence, have a high reliability as a material for electronic parts. Since the said laminates have, in a temperature region above 150° C., a linear expansion coefficient as small as one-half to one-third of that of a conventional epoxy resin-glass cloth laminate, the dimensional change in the face direction resulting from the thermal history in the processing of printed circuit board and in the pressing of a multilayered assembly. Such a high dimensional stability facilitates the fabrication of a printed circuit board having a reference grid size of 1.27 mm and the fabrication of a super high density circuit board such as a printed circuit board of eight or more layers, such fabrication having been difficult with conventional epoxy-glass-type laminates. Since the linear expansion coefficient in the direction of thickness of the multilayer printed circuit board is small, the formation of defects based on the difference in thermal expansion and contraction between the copperplated layer in the through-hole portion and the board when subjected to temperature shock is little and, as a result, the reliability of electronic equipments such as computer, and the like, is enhanced.

The present multilayer printed circuit board is excellent in fundamental properties, such as machinability in drilling, moisture resistance, soldering heat-resistance, and electric properties and the like, which are required for a multilayer printed circuit board. Flame resistance can also be imparted.

The present resin composition is markedly improved in laminating property, curability, and adhesive property, which have been serious disadvantages of a conventional polyaminobismaleimide-based resin composition. regarding the manufacture of a super high density printed circuit board, the merits offered by the present resin composition are great improvements in accuracy, yield, cost and adhesive strength to copper foil (initial adhesion, adhesion when heated, change in adhesive strength with the lapse of time, and that of inner layers) which is the most important factor for the printed circuit board.

Although the present resin composition is very effective for use in a multilayer printed circuit boards which require the highest technique and the highest quality, it can be widely used in laminates for use in heat-resistant structural parts of the space development equipments, aircrafts, heavy electric machines, automobiles, etc.; and laminates and printed circuit boards for use in functional parts of electronic communication equipments; household electric appliances, and industry. Incorporation of a filler into the resin composition allows the composition to be used as a heat-resistant molding material.

The invention is further explained below in detail with reference to Examples, which are by way of illustration and not by way of limitation.

EXAMPLE 1

A varnish containing 45 % by weight of a resin composition was prepared by dissolving in N-methyl-2-pyrrolidone 100 parts by weight of a polyaminobismaleimide obtained by reacting 1 mole of N,N'-4,4'-diphenylmethanebismaleimide with 1 mole of 4,4'-diaminodiphenylethane in the molten state at 150° C. for 30 minutes; 100 parts by weight of a bisphenol-A-type diglycidyl ether having an epoxy equivalent from 450 to 500 [Epikote (registered trademark) 1001 of Shell Chemical Corp.]; 10 parts by weight of a styrene-maleic anhydride copolymer containing 50 mole-% of maleic anhydride.

A sheet of glass cloth, 0.1 mm in thickness, which had been treated with γ-glycidoxypropyltriethoxysilane, was impregnated with the said varnish and dried at 130° C. for 7 minutes by means of a coater-drier to obtain a sheet of B-stage prepreg with a resin content of 40 % by weight.

Sixteen sheets of the prepreg were placed one on another, and electrolytic copper foils of 35 μ thickness, was placed on both outer sides of the resulting assembly and the thus obtained assembly was inserted between two sheets of stainless steel, and heated at 170° C under a pressure of 50 kg/cm² for 2 hrs. by means of a hot-platen press to obtain a two-side copper-clad laminate, 1.6 mm in overall thickness.

The results of test for performance characteristics of the copper-clad laminate thus obtained were as shown in Table 1, wherein the curability was expressed in terms of gel time (second) when the varnish, prepared as mentioned above, was heated on a hot plate at 150° C.

As is seen from Table 1, as compared with a conventional polyaminobismaleimide-based resin composition, the present composition was greatly superior in low-temperature curing ability, and a copper-clad laminate obtained therefrom had excellent mechanical properties and adhesive strength at elevated temperatures and showed little deterioration in these properties even after a long-period heat treatment. The present copper-clad laminate, moreover, had a thermal expansion coefficient as small as one-half to one-third of that of a conventional epoxy resin laminate, a markedly improved soldering heat-resistance, and other excellent characteristic properties requisite to a heat-resistant laminate even without heat treatment after molding.

As shown in Table 1, when the copper-clad laminate was subjected to after-baking at 200° C. for 24 hours, the thermal characteristics were somewhat enhanced, but there was only a small difference between before and after the after-baking.

COMPARATIVE EXPERIMENT 1

The same polyaminobismaleimide as in Example 1 was dissolved in N-methyl-2-pyrrolidone to prepare a varnish containing 50 % by weight of the resin. In the same manner as in Example 1, a sheet of glass cloth, 0.1 mm in thickness, which had been treated with γ-glycidoxypropyltriethoxysilane, was impregnated with the said varnish and dried at 150° C. for 10 minutes to obtain a sheet of B-stage prepreg of a resin content of 40 % by weight.

The prepreg sheets thus prepared were assembled in the same manner as in Example 1 and the assembly was heated at 180° C. under a pressure of 100 kg/cm² for 2.5 hours to obtain a two-side copper-clad laminate, 1.6 mm in overall thickness.

The copper-clad laminate, which had been obtained as mentioned above and then subjected to after-baking at 200° C. for 24 hours, were, as shown in Table 1, excellent in mechanical properties at elevated temperatures and thermal expansion coefficient, but very low in adhesive strength between the copper foil and the board, and hence, was unsatisfactory for use in a multi-layer printed circuit board.

The polyaminobismaleimide resin varnish obtained as mentioned above had a markedly prolonged gel time, and the curing reaction thereof was slow. Accordingly, sufficient characteristics cannot be imparted by the mere press-molding mentioned above, and particularly the adhesive strength to copper foil before after-baking was 0.3 kg/cm. Therefore, the laminate cannot be used in practice.

COMPARATIVE EXAMPLE 2

A varnish containing 30 % by weight of a resin composition was prepared by dissolving 100 parts by weight of a bisphenol-A-type diglycidyl ether having an epoxy equivalent from 450 to 500 [Epikote (registered trademark) 1001] and 12 parts by weight of menthanediamine in methyl ethyl ketone.

In the same manner as in Example 1, a sheet of glass cloth, 0.1 mm in thickness, which had been treated with γ-glycidoxypropyltriethoxysilane, was impregnated with the varnish obtained above, and then dried at 130° C. for 7 minutes to obtain a sheet of B-stage prepreg with a resin content of 40 % by weight.

In the same manner as in Example 1, an assembly of the prepreg sheets obtained above was subjected to heat and pressure by means of a hot-platen press, at 170° C. and 70 kg/cm², for 2.5 hours to obtain a two-side copper-clad laminate, 1.6 mm in overall thickness.

The said copper-clad laminate were, as shown in Table 1, inferior in mechanical strengths and adhesive strength to copper foil at elevated temperatures, deteriorated markedly by the heat-treatment at elevated temperatures, and unsatisfactory in soldering heat-resistance. Therefore, the above copper-clad laminate cannot be used as a heat-resistant laminate in practice. Furthermore, said copper-clad laminate had too large a linear expansion coefficient to use a high density multi-layer printed circuit board.

COMPARATIVE EXAMPLE 3

A varnish containing 45 % by weight of a resin composition was prepared by dissolving 100 parts by weight of the same polyaminobismaleimide as used in Example 1 and 100 parts by weight of a bisphenol-A-type diglycidyl ether having an epoxy equivalent from 450 to 500 [Epikote (registered trademark) 1001] in N-methyl-2-pyrrolidone.

In the same manner as in Example 1, a sheet of glass cloth, 0.1 mm in thickness, which had been treated with γ-glycidoxypyropyltriethoxysilane, was impregnated with the varnish obtained above, and then dried at 150° C. for 5 minutes to obtain a sheet of B-stage prepreg with a resin content of 40 % by weight.

In the same manner as in Example 1, an assembly of the prepreg sheets obtained as mentioned above was subjected to heat and pressure by means of a hot-platen press, at 170° C. and 50 kg/cm², for 2.5 hours to obtain a both side copper-clad laminate, 1.6 mm in overall thickness.

The performance characteristics of this copper-clad laminate were as shown in Table 1. Although the laminate showed relatively good heat resistance without having been subjected to after-baking, yet the excellent heat resistance of the polyaminobismaleimide was not fully developed. After having been subjected to after-baking at 200° C. for 24 hours, the laminate showed some improvement in mechanical properties at elevated temperatures and in linear expansion coefficient, but still insufficient for a heat-resisting laminate.

As compared with a laminate in which a polyaminobismaleimide was used alone, the adhesive strength between the copper foil and the board in this copper-clad laminate was improved to some extent in initial value but still insufficient for a multi-layer printed circuit board which must withstand severe conditions under which the laminate is to be processed and used.

The above-mentioned varnish had a gel time considerably shortened by the addition of the polyepoxy compound, as compared with a varnish containing the polyaminobismaleimide alone, but not enough to be comparable to that of a varnish containing the present resin composition.

EXAMPLE 2

A varnish containing 40 % by weight of a resin composition was prepared by dissolving in dimethylformamide 100 parts by weight of a polyaminobismaleimide obtained by reacting 1.5 moles of N,N'-4,4'-diphenylmethanebismaleimide and 1 mole of N,N'-diaminodiphenylmethane in the molten state at 160° C. for 30 minutes; 200 parts by weight of a brominated bisphenol-A-type diglycidil ether having an epoxy equivalent from 450 to 500 [Epikote (registered trademark) 1045 of Shell Chemical Co.]; and 50 parts by weight of an isobutyl half-ester of a styrene-maleic anhydride copolymer containing 50 mole-% of maleic anhydride.

In the same manner as in Example 1, a sheet of glass cloth, 0.1 mm in thickness, which had been treated with γ-aminopropyltriethoxysilane, was impregnated with the said varnish and dried at 140° C. for 5 minutes to obtain a sheet of B-stage prepreg containing 45 % by weight of a resin composition.

In the same manner as in Example 1, an assembly of the prepreg sheets obtained as mentioned above was subjected to heat and pressure by means of a hot-platen press, at 170° C. and 40 kg/cm², for 2 hours to obtain a two-side copper-clad laminate, 1.6 mm in overall thickness.

As shown in Table 1, this copper-clad laminate is excellent in mechanical properties at elevated temperatures, linear expansion coefficient and soldering heat-resistance, and the adhesive strength between the copper foil and the board is highly in the initial stage, at elevated temperatures, and after heat treatment for a long period of time. Therefore, the laminate is excellent as a heat-resistant laminate. This laminate has an excellent flame resistance, UL class V-O, as tested by UL vertical burning procedure.

EXAMPLES 3 to 9

In a manner similar to that in Example 1, a number of varnishes of various resin compositions were prepared by dissolving different combinations of polyaminomaleimides, polyepoxy compounds, and acid type copolymers in a mixed solvent of N-methyl-2-pyrrolidone and methyl ethyl ketone. A sheet of glass cloth (product of Asahi Schwebel Co.; treated for polyimide laminate), 0.01 mm in thickness, was impregnated with the varnish and dried at 130° – 150° C for 5 – 10 min. to obtain a prepreg having a resin content of 35 – 50 % by weight. The resulting prepreg was heated under pressure together with electrolytic copper foils having a thickness of 35 μ by means of a hot platen press at 160° – 180° C at 40 – 80 kg/cm² for 1.5 – 2.5 hrs. to obtain a two-side copper-clad laminate having an overall thickness of 1.6 mm.

Formulation of the resin composition is shown in Table 2, and gel time of the varnish as well as performance characteristics of the copper-clad laminate are shown in Table 3. As is apparent from Table 3, the present resin compositions showed, over a wide range of formulation, excellent properties at elevated temperatures and an excellent heat resistance; particularly the low-temperature curing ability and adhesive strength to copper foil were greatly superior to those of a conventional polyimide-based resin composition.

EXAMPLE 10

A sheet of glass cloth, 0.1 mm in thickness, was impregnated with the same resin composition as used in Example 1, and dried. In the same manner as in Example 1, an assembly of the prepeg and copper foil was subjected to heat and pressure by means of a hot-platen press to form a two-side copper-clad laminate (75 μ in thickness of copper foil) having an overall thickness of 0.2 mm. An inner circuit board for test bearing a high-density pattern was formed from the laminate. A multi-layer board, 2.0 mm in thickness, was formed from three sheets of the inner circuit board, two sheets of copper-clad laminate with 35 μ copper foil on one side, and several sheets of the prepreg, 0.1 mm in thickness, obtained by use of the resin composition of Example 1. The resulting multilayer board was further fabricated to carry surface circuits and throughholes, thereby obtaining a finished eight-layer printed circuit board. Main performance characteristics of this board were as shown in Table 4.

For comparison, multilayer printed circuit boards were prepared by use of the polyaminobismaleimide resin alone, the epoxy resin, and the polyaminobismaleimide-epoxy resin composition, respectively, used in Comparative Examples 1 to 3, and compared in properties.

As shown in Table 4, the present resin composition exhibited distinguished properties under severe conditions of processing and treatment of the eight-layer printed circuit board; particularly, greatly excellent in the adhesive strength to inner copper foil and the dimensional stability of the board which are required for high-precision printed circuit board.

On the contrary when a conventional resin composition was used, adhesive strength to the inner copper foil was insufficient, deterioration was marked when subjected to temperature-humidity treatment, and dimensional stability of the board was inferior, and did not meet the requirements for a high-precision multilayer printed circuit board.

Table 4

| Item of test (unit) | Sample Treatment and condition | Example 10 | Comparative Example 4 *1 | Comparative Example 5 *2 | Comparative Example 6 *3 |
|---|---|---|---|---|---|
| Solderin | A 260°C, 60 sec d - 2/100 Same as above | No change Same as above | No change Same as above | No change Measling | No change Measling |

Table 4-continued

| Item of test (unit) | Sample Treatment and condition | Example 10 | Comparative Example 4 *1 | Comparative Example 5 *2 | Comparative Example 6 *3 |
| --- | --- | --- | --- | --- | --- |
| heat-resistance | After temperature cycle *4 | Same as above | Peeling | Same as above | Peeling |
| Inner Layer peel strength (kg/cm) | A Separation angle: 90° | 1.3 | 0.3 | 0.7 | 0.5 |
| Halo test | Immersion in HCl = 1/1 at room temp. for 7 min. | No change | No change | Clouding | No change |
| Dimensional change of board (%) | Parallel to laminate | After formation of circuit | | | |
| | | −0.01 | −0.01 | −0.03 | −0.02 |
| | After heat treatment E −0.5/170 | −0.02 | −0.03 | −0.08 | −0.04 |
| | After temperature cycle *5 | −0.03 | −0.05 | −0.10 | −0.06 |
| Linear expansion coeff. of board (°C$^{-1}$) | Prependicular to laminate | Below Tg | $3.1 \times 10^{-5}$ | $3.5 \times 10^{-5}$ | $6.6 \times 10^{-5}$ | $4.0 \times 10^{-5}$ |
| | | Above Tg | $1.4 \times 10^{-4}$ | $1.5 \times 10^{-4}$ | $3.1 \times 10^{-4}$ | $1.8 \times 10^{-4}$ |

Note:
*1 Polyaminobismaleimide in Comparative Example 1 was used.
*2 Epoxy resin in Comparative Example 2 was used.
*3 Polyaminobismaleimide/epoxy resin in Comparative Example 3 was used.
*4 −60° C 10 min. → 100° C 10 min.; 20 cycles.
*5 −65° C 0.5 hr → 25° C 15 min. → 125° C 0.5 hr → 25° C 15 min.; 5 cycles.

EXAMPLE 11

A varnish containing 50 % by weight of resin composition was prepared by dissolving in a dimethylformamide-toluene mixture 100 parts by weight of the same polyaminobismaleimide as used in Example 1, 50 parts by weight of a polyether-type diglycidyl compound obtained by reaction of epichlorohydrin and a dihydric alcohol obtained by reacting bisphenol-A with propylene oxide (Adeka Resin EP-4000 of Asahi Denka Kogyo Co.), and 10 parts by weight of maleic anhydride-α-methylstyrene (45:55 mole-%) copolymer.

A sheet of carbon fiber cloth, 0.3 mm in thickness, which had been treated with γ-aminopropyltriethoxysilane, was impregnated with the varnish and dried at 150° C. for 5 minutes to obtain a prepreg of a resin content of 40 % by weight.

A stack of seven sheets of the prepreg was subjected to heat and pressure by means of a hot-platen press at 170° C and 80 kg/cm² for 2 hours to obtain a carbon fiber-cloth-based laminate, 2.0 mm in thickness. The laminate had a flexural strength of 57 kg/cm² at room temperature and 43 kg/cm² at 200° C. It was suitable for use in heat resistant functional parts.

EXAMPLE 12

A varnish containing 55 % by weight of resin composition was prepared by dissolving in N-methyl-2-pyrrolidone 100 parts by weight of the same polyaminobismaleimide as used in Example 3, 30 parts by weight of a brominated bisphenol-A-type diglycidyl ether having an epoxy equivalent from 450 to 500 [Epikote (registered trademark) 1045], and 30 parts by weight of a maleic anhydride-α-methyl-p-isopropylstyrene copolymer containing 30 mole-% of maleic anhydride.

A sheet of mixed glass-asbestos paper, 0.3 mm in thickness, was impregnated with the varnish and dried at 150° C. for 10 minutes to obtain a sheet of prepreg containing 60 % by weight of the resin composition.

A stack of 6 sheets of the prepreg with a nichrome foil, 0.1 mm in thickness, placed on one side of the stack was subjected to heat and pressure at 180° C. and 100 kg/cm² for 2.5 hours to obtain a one-side nichrome-clad laminate, 1.6 mm in thickness. This laminate had a heat distortion temperature of 182° C., a volume resistivity A of $2 \times 10^{15}$ Ω.cm and $5 \times 10^{14}$ Ω.cm (C-96/40/90) and a flame resistance corresponding to UL class V-O, as tested according to the UL method for vertical burning test. The laminate with such excellent properties is suitable for use in a heat-resistant resistor circuit board, a heater board, or the like.

Table 1

| Item of test (unit) | Testing method | Sample No. Treatment and condition | Example 1 | Example 1 (after-cured) | Comparative Example 1 (after-cured) |
| --- | --- | --- | --- | --- | --- |
| Flexural strength (kg/mm²) | JIS C 6481 | Room temp. | 50 | 51 | 54 |
| | | 150° C. | 46 | 48 | 49 |
| | | After heat treatment *1 A | 43 | 42 | 45 |
| Volume resistivity (Ω.cm) | JIS C 6481 | A | $3 \times 10^{15}$ | $1 \times 10^{15}$ | $5 \times 10^{14}$ |
| | | C - 96/40/90 | $4 \times 10^{14}$ | $2 \times 10^{14}$ | $4 \times 10^{14}$ |
| Thermal expansion coefficient Perpendicular to laminate (°C$^{-1}$) | | Below Tg | $3.2 \times 10^{-5}$ | $3.0 \times 10^{-5}$ | $2.9 \times 10^{-5}$ |
| | | Above Tg | $1.4 \times 10^{-4}$ | $1.3 \times 10^{-4}$ | $1.0 \times 10^{-5}$ |
| Peel strength (separation | | Room temp. | 2.0 | 2.1 | 1.1 |

Table 1-continued

| | | | Comparative Example 2 | Comparative Example 3 | Comparative Example 3 (after-cured) | Example 2 |
|---|---|---|---|---|---|---|
| angle: 90° (kg/cm) | JIS C 6481 | 150° C. | 1.7 | 1.8 | 1.0 | |
| | | After heat treatment *1 | 1.6 | 1.6 | 0.8 | |
| Soldering heat-resistance | JIS C 6481 | Solder bath, 260° C. | No change | No change | No change | |
| | | 30 sec    280° C. | No change | No change | No change | |
| | | floating  300° C. | No change | No change | No change | |
| Curability (min.sec) | | Gel time on hot platen at 150° C. | 5.20 | | 30.00 | |

| Item of test (unit) | Testing method | Treatment and condition | Comparative Example 2 | Comparative Example 3 | Comparative Example 3 (after-cured) | Example 2 |
|---|---|---|---|---|---|---|
| Flexural strength (kg/mm²) | JIS C 6481 | Room Temp. | 36 | 44 | 46 | 45 |
| | | 150° C. | 7 25 | 28 | 42 | |
| | | after heat treatment *1 | 12 *2 C. | 31 | 32 | 40 |
| Volume resistivity (Ω.cm) | JIS C 6481 | A | $5 \times 10^{15}$ | $2 \times 10^{15}$ | $2 \times 10^{15}$ | $6 \times 10^{15}$ |
| | | C - 96/40/90 | $6 \times 10^{14}$ | $200° \times 10^{14}$ | $2 \times 10^{14}$ | $1 \times 200°\ 15$ |
| Thermal expansion coefficent perpendicular to laminate (°C⁻¹) | | Below Tg | $7.1 \times 10^{-5}$ | $4.2 \times 10^{-5}$ | $3.7 \times 10^{-5}$ | $3.5 \times 10^{-5}$ |
| | | Above Tg | $3.8 \times 10^{-4}$ | $2.0 \times 10^{-4}$ | $1.8 \times 10^{-4}$ | $1.5 \times 10^{-4}$ |
| Peel strength (separation angle: 90° (kg/cm) | JIS C 6481 | Room temp. | 1.8 | 1.4 | 1.5 | 2.2 |
| | | 150 ° C. | 0.4 | 0.9 | 1.2 | 1.8 |
| | | After heat treatment *1 | 0.7 *2 | 1.0 | 1.0 | 1.6 |
| Soldering heat-resistance | JIS C 6481 | Solder bath, 260° C. | No change | No change | No change | No change |
| | | 30 sec    280° C. | Peeling | No change | No change | No change |
| | | floating  300° C. | Peeling | Peeling | Peeling | No change |
| Curability (min.sec) | | Gel time on hot platen at 150° C. | 7.30 | 8.50 | | 4.20 |

Note:
*1 After heating in the air at 200° C. for 1,000 hours.
*2 After heating in the air at 200° C. for 200 hours.

Table 2

| Component of resin composition | | | Ex. 3 | Ex. 4 | Ex. 5 | Ex. 6 | Ex. 7 | Ex. 8 | Ex. 9 |
|---|---|---|---|---|---|---|---|---|---|
| 1. Polyaminobismaleimide | | Bisimide/diamine mole ratio | Part by weight | Parts by weight | Parts by weight | Parts by weight | Parts by weight | Parts by weight | Parts by weight |
| N,N'-Bismaleimide | Diamine | | | | | | | | |
| N,N'-4,4'-Diphenylmethane bismaleimide | 4,4'-Diaminodiphenylmethane | 2.0/1.0 | 100 | | | | 80 | | |
| N,N'-4,4'-Diphenylmethanebismaleimide | 4,4'-Diaminodiphenylmethane | 1.0/1.0 | | 60 | | 100 | | | 100 |
| N,N'-m-Phenylenebismaleimide | 4,4'-Diaminodiphenylether | 1.0/1.0 | | | 100 | | | 50 | |
| N,N'-Hexamethylenebismaleimide | 4,4'-Diaminodicyclohexane | 1.0/1.0 | | 40 | | | 20 | 50 | |
| 2. Polyepoxy compound | | Epoxy equivalent | | | | | | | |
| Bisphenol-based, Epikote 828 | | 184/194 | 80 | | | | 50 | | |
| Bisphenol-based, Epikote 1001 | | 450–500 | | 20 | | 30 | | | |
| Polyether-type, Adeka Resin EP-4000 | | 330–360 | 20 | | | | | 10 | 100 |
| Novolak-type, Epikote 154 | | 176–181 | | | 200 | 20 | 100 | | 200 |
| 3. Acidic copolymer | | Monomer ratio (mole-%) | | | | | | | |
| Maleic anhydride/styrene/dimethylstyrene copolymer | | 50/33/17 | 50 | | 50 | | | | 100 |
| 40 mole-% Isobutyl ester of maleic anhydride/dimethylstyrene copolymer | | 60/40 | | 5 | | | 10 | | |
| Monoisopropyl maleate/styrene/α-methylstyrene copolymer | | 50/33/17 | | | | 30 | | | |
| Maleic anhydride/mono-n-pentyl maleate/styrene copolymer | | 20/20/60 | | | | | 70 | | |
| Monoethyl maleate/dimethylstyrene copolymer | | 30/70 | | | 100 | | | | |

Note:
Adeka Resin (registered trademark) EP 4000: a polyepoxy compound manufactured by Asahi Denka Kogyo Co.

Table 3

| Item of test (unit) | Treatment and condition | Example 3 | Example 4 | Example 5 | Example 6 | Example 7 | Example 8 | Example 9 |
|---|---|---|---|---|---|---|---|---|
| Flexural strength (kg/mm²) | Room temperature | 48 | 45 | 40 | 54 | 47 | 48 | 40 |
| | 150°C. | 44 | 42 | 36 | 51 | 43 | 40 | 36 |
| | After heat treatment | 42 | 40 | 32 | 46 | 42 | 38 | 32 |
| Volume resistivity (Ω.cm) | A | $4 \times 10^{15}$ | $2 \times 10^{15}$ | $7 \times 10^{14}$ | $1 \times 10^{15}$ | $5 \times 10^{14}$ | $9 \times 10^{14}$ | $6 \times 10^{14}$ |
| | C - 96/40/90 | $2 \times 10^{14}$ | $3 \times 10^{14}$ | $5 \times 10^{14}$ | $8 \times 10^{14}$ | $2 \times 10^{14}$ | $6 \times 10^{14}$ | $3 \times 10^{14}$ |

Table 3-continued

| Item of test (unit) | Treatment and condition | Example 3 | Example 4 | Example 5 | Example 6 | Example 7 | Example 8 | Example 9 |
|---|---|---|---|---|---|---|---|---|
| Thermal expansion coefficient perpendicular to laminate (°C$^{-1}$) | Below Tg | 3.2×10$^{-5}$ | 3.0×10$^{-5}$ | 3.8×10$^{-5}$ | 2.8×10$^{-5}$ | 3.1×10$^{-5}$ | 3.3×10$^{-5}$ | 3.6×10$^{-5}$ |
|  | Above Tg | 1.2×10$^{-4}$ | 1.3×10$^{-4}$ | 2.1×10$^{-4}$ | 1.0×10$^{-4}$ | 1.3×10$^{-4}$ | 1.5×10$^{-4}$ | 2.0×10$^{-4}$ |
| Peel strength (separation angle: 90°) (kg/cm) | Room temperature | 2.1 | 1.8 | 2.2 | 2.0 | 2.3 | 1.7 | 1.9 |
|  | 150° C. | 1.8 | 1.6 | 1.6 | 1.7 | 1.6 | 1.5 | 1.7 |
|  | After heat treatment | 1.9 | 1.7 | 1.9 | 1.8 | 1.8 | 1.6 | 1.7 |
| Soldering heat-resistance | Solder bath 260° C. 30 sec. | No change | No change | No change | No change | No change | No change | No change |
|  | 280° C. floating | No change | No change | No change | No change | No change | No change | No change |
|  | 300° C. | No change | No change | No change | No change | No change | No change | No change |
| Curability (mini·sec) | Gel time on hot platen at 150° C. | 3.30 | 10.00 | 2.10 | 8.40 | 5.20 | 7.50 | 3.20 |

What is claimed is:

1. A heat-resistant laminating resin composition consisting essentially of 100 parts by weight of a polyaminobismaleimide obtained by reacting at least one N,N'-bismaleimide represented by the general formula [I],

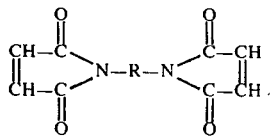

[I]

wherein R represents an aliphatic, cycloaliphatic, or aromatic divalent radical, with at least one diamine selected from the group consisting of aliphatic diamines, cycloaliphatic diamines, and aromatic diamines, 10 to 300 parts by weight of a polyepoxy compound having in the molecule at least two epoxy groups, and 5 to 150 parts by weight of at least one copolymer selected from the group consisting of (A) copolymers of aromatic vinyl compounds and maleic anhydride, (B) partial alkyl esters of said copolymers (A), (C) copolymers of aromatic vinyl compounds and alkyl maleates, and (D) copolymers of aromatic vinyl compounds, maleic anhydride, and alkyl maleates.

2. A heat-resistant laminating resin composition according to claim 1, wherein the ratio of the N,N'-bismaleimide to the diamine is one mole of the double bond present in said bisimide to 0.5 to 3 moles of the active hydrogen present in said diamine.

3. A heat-resistant laminating resin composition according to claim 1, wherein the polyaminobismaleimide has a melting point in the range from 50° to 150° C.

4. A heat-resistant laminating resin composition according to claim 1, wherein the polyepoxy compound is an epoxy resin having an epoxy equivalent of 100 to 4,000.

5. A heat-resistant laminating resin composition according to claim 1, wherein the copolymer (A) contains in the molecule at least 30 mole-% of maleic anhydride structural units.

6. A heat-resistant laminating resin composition according to claim 1, wherein the copolymer (B) has an esterification degree of at most 50 mole-% based on the total maleic anhydride structural units before esterification.

7. A heat-resistant laminating resin composition according to claim 1, wherein the copolymer (C) contans in the molecle at least 30 mole-% of monoalkyl maleate structural units.

8. A heat-resistant laminating resin composition according to claim 1, wherein the copolymer (D) contains in the molecule at least 30 mole-%, in total, of the maleic anhydride structural units and the monoalkyl maleate structural units.

9. A heat-resistant laminating resin composition according to claim 1, wherein the weight ratio of the polyepoxy compound to the at least one copolymer selected from the group consisting of the copolymers (A), (B), (C), and (D) is in the range from 0.5 to 10.0.

10. A method for preparing a heat-resistant laminating resin prepreg, which is characterized by impregnating a fibrous insulating base material with a varnish obtained by dissolving the resin composition according to claim 1 in an inert solvent, heating the impregnated base material to dryness to alloy the resin composition to react the B-stage.

11. A method for manufacturing a heat-resistant resin laminate, which comprises applying simultaneously heat and pressure to one sheet of or a stack of several tens of superposed sheets of the prepreg obtained by the method according to claim 10.

12. A method for manufacturing a metal-clad heat-resistant resin laminate, which comprises applying simultaneously heat and pressure to one sheet of or a stack of several tens of superposed sheets of the prepreg obtained by the method according to claim 10, said stack having been overlaid with a metal foil.

13. A method according to claim 10, wherein the fibrous insulating base material is a glass fabric.

14. A method according to claim 11, wherein the fibrous insulating base material is a glass fabric.

15. A method according to claim 12, wherein the fibrous insulating base material is a glass fabric.

16. A method according to claim 15, wherein the metal foil is a copper foil.

17. A method for manufacturing a multilayer heat-resistant resin printed circuit board, which comprises using the prepreg obtained by the method according to claim 13 as an inner circuit board and/or a surface circuit board and/or an interlayer adhesive sheet and applying heat and pressure.

18. A heat-resistant resin prepreg obtained by the method according to claim 10.

19. A heat-resistant resin prepreg obtained by the method according to claim 13.

20. A heat-resistant resin laminate obtained by the method according to claim 11.

21. A heat-resistant resin laminate obtained by the method according to claim 14.

22. A metal-clad heat-resistant resin laminate obtained by the method according to claim 12.

23. A metal-clad heat-resistant resin laminate obtained by the method according to claim 15.

24. A copper-clad heat-resistant resin laminate obtained by the method according to claim 16.

25. A multilayer heat-resistant printed circuit board obtained by the method according to claim 17.

* * * * *